United States Patent [19]

Roesler

[11] 4,283,639
[45] Aug. 11, 1981

[54] DEVICE FOR PRODUCING TWO CLOCK PULSE TRAINS FROM A PERIODIC SIGNAL OF ANY WAVEFORM

[75] Inventor: Helmut Roesler, Munich, Fed. Rep. of Germany

[73] Assignee: Siemens Aktiengesellschaft, Berlin & Munich, Fed. Rep. of Germany

[21] Appl. No.: 62,767

[22] Filed: Aug. 1, 1979

[30] Foreign Application Priority Data

Aug. 30, 1978 [DE] Fed. Rep. of Germany ....... 2837855

[51] Int. Cl.$^3$ .............................................. H03K 5/00
[52] U.S. Cl. .................................... 307/269; 307/262; 328/62
[58] Field of Search ................... 307/269, 262; 328/62

[56] References Cited

U.S. PATENT DOCUMENTS

| 3,393,367 | 7/1968 | Vallee | 328/62 |
| 3,473,051 | 10/1969 | Kardash | 307/269 |
| 3,619,793 | 11/1971 | Broome | 328/62 |
| 3,961,269 | 6/1976 | Alvarez | 328/62 |

FOREIGN PATENT DOCUMENTS

| 2015129 | 3/1970 | Fed. Rep. of Germany. |
| 2345837 | 3/1975 | Fed. Rep. of Germany. |

Primary Examiner—Harold A. Dixon
Attorney, Agent, or Firm—Hill, Van Santen, Steadman, Chiara & Simpson

[57] ABSTRACT

A device for producing two clock pulse trains from a periodic signal comprised of waveforms of any shape produces digital pulses having the same period and further having respective duty cycles which are separated by pauses when the pulse series are aligned. The device consists two flip flop cells and two push-pull transistor outputs respectively connected thereto, each push-pull output having an output tap between the transistors. One flip flop cell is connected directly to a waveform source, and the other flip flop cell is connected to the waveform source via a transistor follower circuit.

14 Claims, 2 Drawing Figures

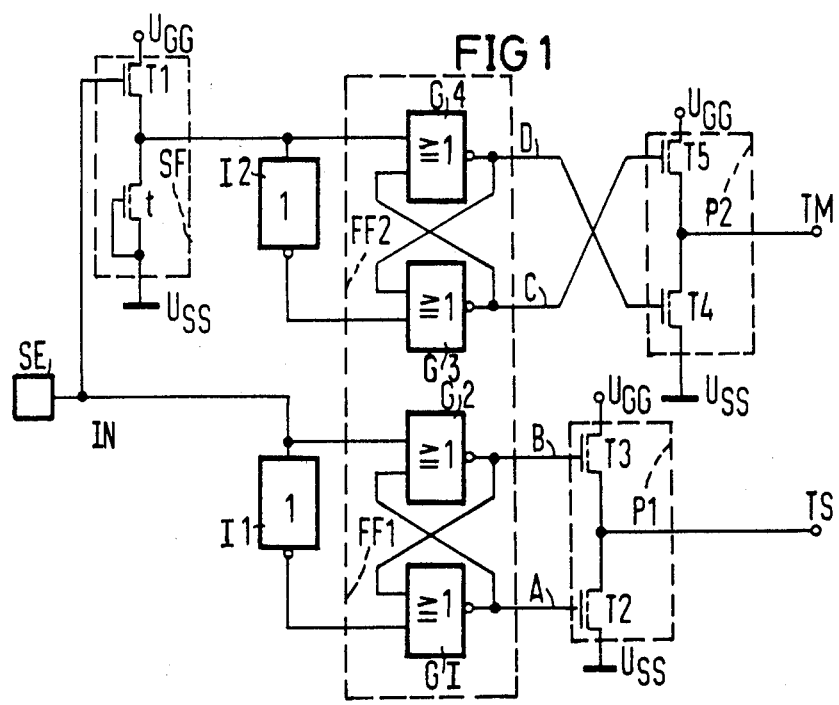
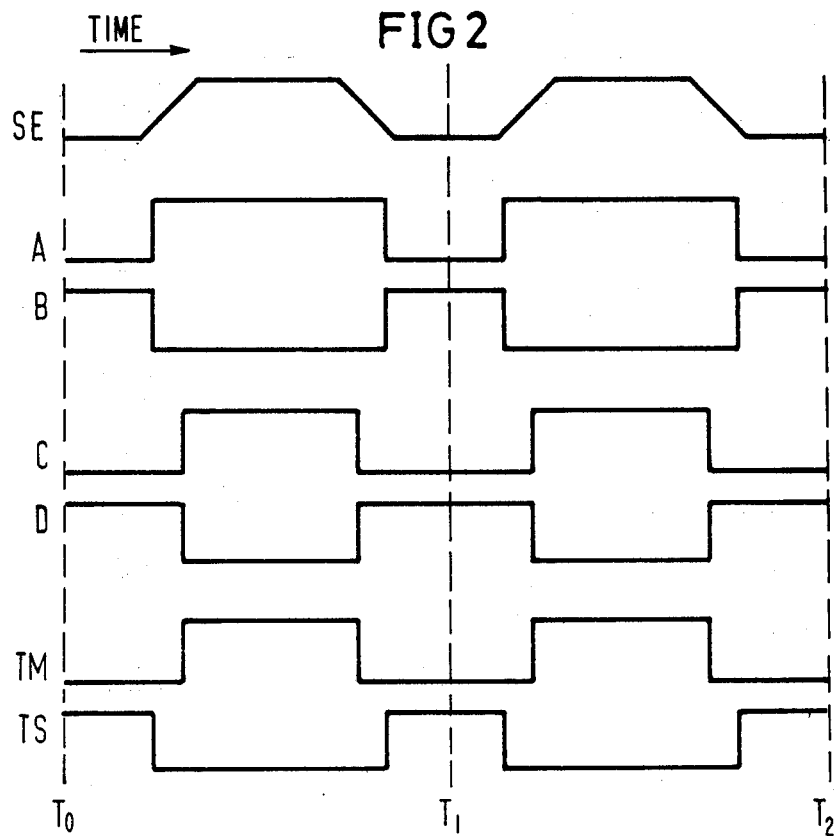

DEVICE FOR PRODUCING TWO CLOCK PULSE TRAINS FROM A PERIODIC SIGNAL OF ANY WAVEFORM

BACKGROUND OF THE INVENTION

1. Field of the Invention

The present invention relates to a device for producing two clock pulse trains to serve as a clock pulse supply for digital semiconductor circuits, and in particular for producing such clock pulse trains from a periodic input signal having any waveform, and in which the clock pulse trains have the same period but have duty cycles which are separated by down time when the pulses are aligned.

2. Description of the Prior Art

A generator for the clock control of monolithically integrated digital semiconductor circuits is disclosed in German OS No. 23 45 837 which produces two series of periodic digital pulses. The pulses of the two series thus produced are phase shifted opposite one another by the same time value.

The pulses thus produced are of the conventional rectangular-shaped profile having two different voltage states, one of which corresponds to the logical zero and the other to the logical one and in which the duty cycle of the individual pulse is associated with only one of these logical states. The other state generally corresponds to the information less state.

Another clock pulse circuit is disclosed in German OS No. 27 13 319 in which a pulse converter which operates from an input of periodic electrical pulses, operates on the input pulses to produce two separate output pulse trains having a defined time relationship such that, when aligned, the two output pulse series have duty cycles which are separated from each other by down time. Interfering overlapping of the duty cycles in the digital circuit which is controlled by the clock is thus significantly minimized, because the presence of the down time between the duty cycles compensates for the effect of transit time differences in the controlled circuit.

SUMMARY OF THE INVENTION

It is an object of the present invention to provide a device for producing two clock pulse trains from a single periodic signal input of any waveform such that the two pulse train outputs are of the same frequency, but the duty cycle of one train is longer than the duty cycle of the other. The invention may be utilized with an input pulse consisting of trapezoidal, triangular or sinusoidal pulses, or any other signal consisting of periodic waveforms.

The device disclosed herein for achieving this object consists of an input connected to a control signal source for introducing periodic signals having any waveform into the circuit for modification thereof. The control signal source is directly connected to the inverting and non-inverting inputs of one flip-flop cell, and is connected to the inverting and non-inverting inputs of another flip-flop cell through a transistor follower circuit. The outputs of the first and second flip-flop cells are respectively connected to first and second push-pull outputs which are each comprised of two transistors connected in series which are baised on one side by a reference potential which serves to set a voltage divider level, and on the other side at an operating potential which is of a magnitude at least sufficient to also serve as the current supply for the two flip-flop cells. A tap between the two transistors of each of the push-pull outputs serves as one signal output for the device.

The push-pull outputs may be series circuits comprised of either two bipolar transistors of the same type, i.e., either both npn transistors or both pnp transistors, or may be comprised of field effect transistors, in particular MOS field effect transistors.

The transistor follower circuit serves as a voltage level divider which in the simplest embodiment may consist of two resistors connected in series, having one terminal at a common reference potential and the other terminal at the control signal input of the device. The voltage divider tap is directly connected with one input of one of the flip-flop cells, and is connected to the other input through an inverter. Each of the flip-flop cells may be of the reset type as is well known in the art.

The voltage divider may also be comprised of a transistor circuit utilizing the same baising potentials which serve as the voltage supplies for the push-pull outputs, namely the operating potential and the reference potential. Such a voltage level divider may consist of a bipolar transistor in an emitter-follower circuit arrangement, the base of which is connected to the control signal input of the device, the collector of which is connected to the operating potential and the emitter of which is connected in series with a resistor to the reference potential. A tap between the transistor and the series resistor is then connected directly to one input of one of the flip-flop cells and through an inverter to the second input of the flip-flop cell.

The voltage level divider may also consist of a field effect transistor circuit, in particular utilizing MOS technology, having a gate which is connected to the control signal input of the device, the drain of which is connected with the operating potential, and the source of which is connected through a series resistor with the reference potential. Again, a tap between the resistor and the drain of the field effect transistor serves as the output of the voltage divider which is connected both directly, and through an inverter, to respective inputs of one of the flip-flop cells.

If MOS technology is utilized, it is also advantageous to simultaneously manufacture a second field effect transistor having its gate shorted to the reference potential, so that the transistor represents a resistive impedence and may thus serve the place of the resistor.

The two push-pull outputs may also be constructed in embodiments using bipolar transistors or field effect transistors, in particular MOS field effect transistors.

If bipolar transistors are utilized to construct the push-pull outputs, the base of each such transistor is connected with one of the two outputs of the associated flip-flop cell, and the collector of one of the transistors is connected to the operating potential while the emitter of the other transistor is connected to the reference potential, and the remaining emitter and collector are connected to each other. A tap between the emitter-collector connection serves as a signal output for the device.

If field effect transistors are utilized to comprise the push-pull output, a similar circuit connection is undertaken. The drain of one of the field effect transistors is connected to the operating potential, while the source of the other field effect transistor is connected to the reference potential, with the remaining source and drain being connected to each other. The gates of each of the field effect transistors are connected to the outputs of the associated flip-flop cell. Again, a tap between the source-drain connection path serves as an output. Production can be simplified if the two field effect transistors used in the push-pull output are of the same type, however, an embodiment utilizing complimentary technology, in particular CMOS technology may be utilized if the particular advantages of that technology are required.

A proved embodiment utilizing totally MOS technology has the control signal input connected to the signal input of a source follower circuit serving as a voltage divider, which is connected to the inverting and non-inverting inputs of a first flip-flop cell, and has a second flip-flop cell with its inverting and non-inverting inputs directly connected to the control signal input. The two signal outputs of each of the first and second flip-flop cells are connected to the gates of two pairs of field effect transistors which serve as the push-pull outputs, and which are supplied by the same operating potentials as the source-follower circuit and the two flip-flop cells. Output taps are taken from a common point between the transistors comprising each transistor pair.

BRIEF DESCRIPTION OF THE DRAWINGS

FIG. 1 illustrates a circuit diagram of a device for producing two clock pulse trains from a periodic signal of any waveform constructed in accordance with the principles of the present invention.

FIG. 2 is a graphic representation of signals appearing at various points in the circuit of FIG. 1.

DESCRIPTION OF THE PREFERRED EMBODIMENTS

A device for producing two clock pulse trains from any periodic waveform input, said pulse trains having duty cycles which are separated by down time when aligned, is shown in FIG. 1. The device of FIG. 1 has an input IN to which is connected a control signal supply or source SE. The control signal source SE supplies a periodic signal which may consist of waveforms of any shape. It is frequently the case that such periodic signals will consist of trapezoidal, triangular or sinusoidal waveforms, however, the device of FIG. 1 can accommodate and operate on waveforms of any shape.

The control pulse input is connected directly to a first flip-flop cell FF1 which is comprised of two cross connected NOR gates G1 and G2. One input to the gate G2 is directly connected to the control pulse supply SE, while the other gate G1 has an inverter I1 interconnected between one of its inputs and the pulse supply SE.

The pulse supply SE is also connected to a source follower circuit, generally shown at SF. The source follower circuit consists of a MOS field effect transistor T1 having its gate connected to the control pulse source SE and has its drain connected to an operating potential $U_{GG}$. The source of the transistor T1 is connected to a resistive element, which in the embodiment in FIG. 1 is another field effect transistor t having its gate shorted to a reference potential $U_{SS}$. When connected in this manner, the transistor t exhibits a resistive impedance, and can be conveniently manufactured with the other elements in the circuit utilizing MOS technology.

An output tap between the series connection of the transistor T1 and t is connected to a second flip-flop FF2 comprised of cross connected NOR gates G3 and G4. One input of the gate G4 is directly connected to the source follower SF, while one input of the gate G3 is connected to the source follower SF through an inverter I2.

In constructing the NOR gates G1, G2, G3 and G4 in MOS technology, field effect transistors of the same type are frequently employed having respective gates forming the signal inputs of the NOR gates, and having source regions at the common reference potential $U_{SS}$ and having drains serving as the signal output for the NOR gates. The drains are connected to the operating potential through a load resistor, which may in fact be a field effect transistor connected in the manner of transistor t.

The two inverters I1 and I2 are constructed as is known in the art including a drive transistor, the gate of which forms the signal input of the inverter and the source connection of which lies at the reference potential $U_{SS}$ and the drain connection of which is connected through a load resistor to the operating potential $U_{GG}$, and serves as the signal output.

The control signal input SE may also be capacitively connected to the reference potential $U_{SS}$ and may be operated to produce any desired waveform, such as the signal designated SE1 in FIG. 2. As is the case with all of the signals represented in FIG. 2, the signals have a period T starting at $T_0$ and repeating at $T_1$ and $T_2$.

The control input SE is connected with the gate of the input transistor T1 of the source follower SF, which, as discussed above, is connected to the operating potential $U_{GG}$ and $U_{SS}$. The input transistor T1 of the source follower SF is designed as a MOS field effect transistor operating in the depletion mode. Similarly, the load resistor t and the load resistors in the gates G1, G2, G3 and G4 and in the inverters I1 and I2 are also MOS field effect transistors operating in the depletion mode having their gate electrodes connected to operate the transistors as resistances. The input or drive transistors of the gates, on the other hand, consist of MOS field effect transistors operating in the enhancement mode.

The operation of the flip-flop cells FF1 and FF2 on the input signal SE1 is somewhat analogous to the use of a Schmitt trigger, acting in one respect to steepen the pulse edges. The outputs A and B of the cell FF1 and the outputs C and D of the cell FF2 are shown in FIG. 2. The operation of the source follower circuit SF as a voltage divider results in a shortened duty time for the outputs C and D.

The outputs of the flip-flop cells FF1 and FF2 are respectively connected to inputs of two transistor pairs P1 and P2. The pairs P1 and P2 serve as push-pull outputs and consist of MOS field effect transistors T2, T3, T4 and T5 operating in the enhancement mode. The respective drains of transistors T3 and T5 are connected to the operating potential $U_{GG}$. The respective sources of transistors T2 and T4 are connected to the reference potential $U_{SS}$.

The gates of transistors T2 and T3 are respectively connected to the outputs A and B of the first flip-flop cell FF1, while the gates of transistors T4 and T5 are respectively cross connected to the outputs D and C of the second flip-flop cell FF2.

An output tap TS for the pair P1 is connected to the common drain-source connection between transistors T2 and T3, and similarly, an output tap TM for the transistor pair P2 is connected to the drain-source connection between transistors T4 and T5.

The form of the signals which appear at the signal outputs TS and TM are shown in FIG. 2. It will be understood that the signals TM and TS can also be utilized in inverted form without additional loss of transist time if the connections between the cells FF1 and FF2 to the pairs P1 and P2 are reversed, i.e., output A is connected to the gate of transistor T3 and the output B is connected to the gate of transistor T2, and the output C is directly connected to transistor T4 with the output D directly connected to the transistor T5.

The operative requirement is that one of the transistors whose drain (or collector) is connected to the operating potential $U_{GG}$ have its gate (or base) connected to that output of the associated flip-flop which has the logic value after a change-of-state which is the same logic value that initiates the change of state at the inverted input of the flip-flop. The remaining transistor in each pair having its source (or emitter) connected to the reference voltage $U_{SS}$ then must have its gate (or base) connected to the remaining output of the flip-flop associated therewith.

By the combined operation of the first flip-flop cell FF1 and the first push-pull output pair P1 and the second flip-flop cell FF2 operating in association with the second push-pull output pair P2 the clock pulses TM and TS are separated. The difference between the two duty cycles proceeds through the clock signal in a short time span, which nevertheless determines the length of time of the down times between the duty cycles of the clock pulses. Because the two transistors comprising each of the pairs P1 and P2 can not be conductive at the same time only a capacitive cross-current can flow between them.

The disclosed circuit can be realized in both bipolar technology as well as MOS technology. Because the pulse device is most likely to be utilized with other integrated semiconductor circuits supplied on semiconductor chips, the particular environment of the intended circuit use will determine whether bipolar or MOS technology is the most appropriate.

It will be noted that the pulse frequency has an upward limit defined by the total RC time of the oscillator. There is no theoretical lower frequency limit.

Although modifications and changes may be suggested by those skilled in the art it is the intention of the inventors to embody within the patent warranted hereon all changes and modifications as reasonably and properly come within scope of their contribution to the art.

I claim as my invention:

1. A pulse transformer with two signal outputs at which different digital pulses with the same period appear for producing a clock supply to digital semiconductor circuits, for use with a control input source which supplies periodic control signals to a transformer input, said transformer comprising:

a first flip-flop cell having inverted and non-inverted signal inputs connected to said control input source and having two signal outputs;

a voltage level divider having an input connected to said control input source and having an output tap;

a second flip-flop cell having inverted and non-inverted inputs connected to said output of said voltage level divider, and having two signal outputs;

a first push-pull output circuit having two inputs respectively connected to said two signal outputs of said first flip-flop cell;

a second push-pull output circuit having two inputs respectively connected to said two signal outputs of said second flip-flop cell;

said first and second push-pull output circuits each comprising two series connected transistors, one of said transistors connected to a reference potential and the other of which is connected to an operating potential, and each push-pull output circuit further having one circuit point lying between the two transistors comprising the circuit, said circuit points forming said two transformer signal outputs; and said operating potential also serving as a current supply for said first and second flip-flop cells, and said reference potential also serving as a reference potential also serving as a reference potential for said voltage level divider and said first and second flip-flop cells.

2. The transformer of claim 1 wherein each push-pull output circuit consists of two bipolar transistors of the same type having base connections to respective outputs of said first and second flip-flop cells, one of said transistors having a collector connected to the operating potential and the other transistor having an emitter connected to the reference potential, with said remaining emitter and collector of the respective transistors connected to form said circuit point for said transformer signal output.

3. The transformer of claim 1 wherein said push-pull outputs each comprise two field effect transistors of the same type each having a gate connected to an output of said respective first and second flip-flop cells, one field effect transistor having a source connection to said reference potential and the other field effect transistor having a drain-connection to said operating potential, with the remaining drain and source connections of the respective field effect transistors connected and serving as said circuit point for said transformer signal output.

4. The transformer of claim 1 wherein said voltage level divider consists of a bipolar transistor connected in an emitter-follower circuit, the base of said transistor connected to said control signal input, the collector of said transistor connected to the operating potential and the emitter of said transistor connected through a series resistor to the reference potential, with said output tap of the voltage level divider taken at a point between the emitter and the resistor.

5. The transformer of claim 1 wherein said voltage level divider is a field effect transistor connected in a source-follower circuit, said transistor having a gate connected to the control signal input, and having a drain connected to the operating potential and a source connected through a series resistor to the reference potential, with the output tap of the voltage level divider taken at a point between the source and the resistor.

6. The transformer of claim 1 wherein said first and second flip-flop cells are reset flip-flop cells and that one input of said first flip-flop cell is connected directly to said control signal input and the other input of said first flip-flop cell is connected to said control signal input through an inverter, and one input of said second flip-flop cell is connected directly to the output of said voltage level divider and the other input of said second flip-flop cell is connected to the output of said voltage level divider through an inverter.

7. The transformer of claim 3 wherein said field effect transistor in said first push-pull output circuit having its drain connected to the supply potential has its gate connected to an output of said first flip-flop cell having a logical state after the change of state of the first flip-flop cell which corresponds to the logic state which initiates the change of state at the inverted signal input of the first flip-flop cell, and the gate of the other transistor of the first push-pull output is connected to the other output of the first flip-flop cell.

8. The transformer of claim 7 wherein the field effect transistor in the second push-pull output having its source connection at the reference potential has its gate connected to the output of the second flip-flop cell having a logical state after the change of state of the flip-flop cell which corresponds to the logical state which initiates the change of state at the inverted input of the second flip-flop cell, and the gate of the other transistor of the second push-pull output is connected to the other output of the second flip-flop cell.

9. The transformer of claim 3 wherein the field effect transistor of the first push-pull output circuit having its source connection at the reference potential is connected by its gate to the output of the first flip-flop cell having a logical state after a change of state of the first flip-flop cell which corresponds to the logical state which initiates the change of state at the inverted signal input of the first flip-flop cell, and the gate of the other transistor of the first push-pull output is connected to the other output of the first flip-flop cell.

10. The transformer of claim 9 wherein the field effect transistor of the second push-pull output circuit having its drain connection at the supply potential has its gate connected to the output of the second flip-flop cell having a logical state after a change of state of the second flip-flop cell which corresponds to the logical state which initiates the change of state at the inverted input of the second flip-flop, and the gate of the other transistor of the second push-pull output circuit is connected to the other output of the second flip-flop cell.

11. The transformer of claim 1 wherein the first and second flip-flop cells are comprised of field effect transistors and wherein all field effect transistors in said transformer which have signal controlled gates are operated in the enhancement mode, and all resistors in said transformer are comprised of field effect transistors having a gate connection shorted to said reference potential and operate in the depletion mode.

12. A monolithic integrated circuit for producing two periodic pulse trains of the same frequency having respective duty cycles of differing duration such that when aligned said duty cycles are separated by non-duty cycle intervals, said circuit for use with a control signal input for supplying periodic waveforms of any shape to said circuit, said circuit comprising:

a first flip-flop cell of the reset type, said first flip-flop cell having inverting and non-inverting inputs connected to said control signal input, and having a first output having a logical state after a change of state corresponding to the logical state which initiates the change of state, and a second output;

a voltage divider comprised of a first transistor having a controlled input connected to said control signal input and a first electrode connected through a series resistor to a reference potential and a second electrode connected to an operating potential, and an output tap between said first electrode and said series resistor;

a second flip-flop cell of the reset type having inverting and non-inverting inputs connected to said voltage divider output, said second flip-flop cell having a first output having a logical state after a change of state corresponding to the logical state which initiates the change of state, and a second output;

a first push-pull output circuit comprised of second and third series connected transistors of the same type, each transistor having a controlled input electrode and first and second electrodes, the second transistor having its first electrode connected to the reference potential and the third transistor having its second electrode connected to the operating potential, with the remaining second and first electrodes connected to each other with an output tap taken at a point between said transistors, the controlled input electrodes of the second and third transistors connected to the respective second and first outputs of said first flip-flop cell; and a second push-pull output circuit comprised of fourth and fifth series connected transistors of the same type, each transistor having a controlled input electrode and first and second electrodes and the fourth transistor having its first electrode connected to the reference potential and the fifth transistor having its second electrode connected to the operating potential, with the remaining second and first electrodes connected to each other with an output tap taken at a point between said transistors, with the controlled input of the fourth and fifth transistors connected to the respective first and second outputs of said second flip-flop cell.

13. The circuit of claim 12 wherein said first, second, third, fourth and fifth transistors are bipolar transistors and in which the respective bases of said transistors are said controlled inputs thereof, and said first electrodes are the emitters of said transistors and said second electrodes are the collectors of said transistors.

14. The circuit of claim 12 wherein said first, second, third, fourth and fifth transistors are field effect transistors, and wherein the respective gates of said transistors are the controlled inputs thereof, and the respective sources of said transistors are the first electrodes thereof and the respective drains of said transistors are the second electrodes thereof.

* * * * *